United States Patent
Hochman et al.

(10) Patent No.: US 10,333,109 B2
(45) Date of Patent: Jun. 25, 2019

(54) VISUAL-DISPLAY STRUCTURE HAVING A METAL CONTRAST ENHANCER, AND VISUAL DISPLAYS MADE THEREWITH

(71) Applicant: Revolution Display, LLC, Glendale, CA (US)

(72) Inventors: Jeremy Hochman, Walnut, CA (US); Arnaud Latombe, Round Rock, TX (US); Robbie Thielemans, Nazareth (BE)

(73) Assignee: Production Resource Group, L.L.C., Armonk, NY (US)

( * ) Notice: Subject to any disclaimer, the term of this patent is extended or adjusted under 35 U.S.C. 154(b) by 0 days.

(21) Appl. No.: 16/003,883

(22) Filed: Jun. 8, 2018

(65) Prior Publication Data

US 2018/0358582 A1  Dec. 13, 2018

Related U.S. Application Data

(60) Provisional application No. 62/517,566, filed on Jun. 9, 2017.

(51) Int. Cl.
*G09F 9/30* (2006.01)
*G09F 9/33* (2006.01)
(Continued)

(52) U.S. Cl.
CPC .... *H01L 51/5281* (2013.01); *G02F 1/133512* (2013.01); *G09F 9/30* (2013.01);
(Continued)

(58) Field of Classification Search
CPC . H01L 51/5281; H01L 51/56; H01L 27/3293; H01L 51/504; H01L 51/5064;
(Continued)

(56) References Cited

U.S. PATENT DOCUMENTS

| 7,559,673 B2 | 7/2009 | Meersman et al. |
| 9,045,818 B2 | 6/2015 | Gersdorff et al. |

(Continued)

FOREIGN PATENT DOCUMENTS

| EP | 1515297 A1 | 3/2005 |
| EP | 1645800 A2 | 4/2006 |
| WO | 9941788 A1 | 8/1999 |

OTHER PUBLICATIONS

International Search Report and Written Opinion in connection with PCT/US2018/036625, dated Sep. 5, 2018.

*Primary Examiner* — Joseph L Williams
*Assistant Examiner* — Jose M Diaz
(74) *Attorney, Agent, or Firm* — Downs Rachlin Martin PLLC

(57) ABSTRACT

Display structures for displays having spaced-apart light-emitting elements. In some embodiments, a display structure includes a metallic contrast enhancer having apertures corresponding to the light-emitting elements. The light-emitting elements may be, for example, integrally formed with a substrate or packaged elements applied to a printed circuit board. In some embodiments, a metallic contrast enhancer of the present disclosure may be incorporated into a touch sensor that can allow a visual display incorporating the touch sensor to operate as a touch screen. Such a touch sensor may be, for example, projected capacitive, surface capacitive, digital-type resistive, or analog-type resistive. In some embodiments, a contrast enhancer may include one or more permanent graphic elements to enhance a visual display.

19 Claims, 7 Drawing Sheets

(51) Int. Cl.
*H04R 3/00* (2006.01)
*H04R 3/04* (2006.01)
*H01L 27/15* (2006.01)
*H01L 27/32* (2006.01)
*H01L 51/52* (2006.01)
*H01L 51/56* (2006.01)
*G02F 1/1335* (2006.01)
*H01L 25/075* (2006.01)

(52) U.S. Cl.
CPC ............ *G09F 9/33* (2013.01); *H01L 27/3293* (2013.01); *H01L 51/56* (2013.01); *H04R 3/007* (2013.01); *H04R 3/04* (2013.01); *H01L 25/0753* (2013.01); *H01L 27/156* (2013.01)

(58) Field of Classification Search
CPC ... H01L 51/508; H01L 51/5278; H04R 3/007; G09F 9/33; H05B 33/12; H05B 33/22; H05B 33/24
See application file for complete search history.

(56) References Cited

U.S. PATENT DOCUMENTS

| | | | |
|---|---|---|---|
| 9,202,394 B2 | 12/2015 | Meersman | |
| 9,432,785 B2 | 8/2016 | Kappus et al. | |
| 2003/0173891 A1 | 9/2003 | Chiba et al. | |
| 2005/0007535 A1* | 1/2005 | Hirakata | G02F 1/134363 349/141 |
| 2011/0156616 A1 | 6/2011 | Anderson et al. | |
| 2014/0085250 A1 | 3/2014 | Cok | |
| 2014/0367652 A1* | 12/2014 | Cho | H01L 27/3244 257/40 |
| 2015/0331508 A1* | 11/2015 | Nho | G06F 3/0421 345/173 |
| 2016/0197134 A1 | 7/2016 | Jung et al. | |
| 2016/0322444 A1* | 11/2016 | Kang | H01L 27/3272 |
| 2018/0144844 A1* | 5/2018 | Sivarajan | C01B 32/158 |
| 2018/0182816 A1* | 6/2018 | Kang | H01L 27/323 |
| 2018/0269417 A1* | 9/2018 | Sudo | H01L 27/322 |

* cited by examiner

VISUAL-DISPLAY STRUCTURE HAVING A METAL CONTRAST ENHANCER, AND VISUAL DISPLAYS MADE THEREWITH

FIELD OF THE INVENTION

This application claims the benefit of priority of U.S. Provisional Patent Application Ser. No. 62/517,566, filed on Jun. 9, 2017, and titled "VISUAL DISPLAY STRUCTURE HAVING A METAL CONTRAST ENHANCER, AND PANEL-TYPE DISPLAYS MADE THEREWITH", which is incorporated by reference herein in its entirety.

FIELD OF THE INVENTION

The present invention generally relates to the field of discrete-light-emitting-package-based displays. In particular, the present invention is directed to a display structure having a metal contrast enhancer, and visual displays made therewith.

BACKGROUND

One type of light emitting diode (LED) based visual display typically includes packages of LEDs mounted to one or more printed circuit boards (PCBs) in an array, with each of the LED packages configured to form a portion of a pixel or one or more pixels of an image formed on the LED display. The LED packages are typically spaced from adjacent LED packages by a certain distance in each of the x- and y-directions of the display panel. To maximize the contrast of the LED display, it is preferable for the material in the spaces between the LED packages to have relatively uniform light-diffusing and/or light-absorbing qualities, such as provided by a uniform black material having a matte finish. The color and finish of the sides of the LED packages and the top surface of the PCB, however, are typically not as uniform, light-absorbing, or light-diffusing as desired. To address this, a shader mask, also known as a "contrast enhancer," is typically applied to the LED display.

Conventionally, a contrast enhancer is a piece of plastic having a relatively uniform black color and matte finish and is sized and configured to be disposed on the LED-package-mounting surface of the PCB in the spaces between the LED packages. Some contrast enhancers also have features that extend in a "z-direction" that is perpendicular to the LED-package-mounting surface of the PCB and towards the audience. These features are sometimes referred to as "louvers" and are provided to shade the LED packages from ambient light to improve contrast and reduce glare. In some high-pixel density displays, for example, displays having less than approximately 2 mm pixel pitch, due to the tight spacing between adjacent LED packages contrast enhancers may not include z-axis features for light protection and only cover the exposed top surface of the PCB between the LED packages.

SUMMARY

In one implementation, the present disclosure is directed to a visual-display structure. The structure includes a plurality of light-emitting elements (LEEs) arranged in an array so as to provide a plurality of pixels, wherein ones of the plurality of LEEs are physically spaced from one another to form inter-LEE spaces; a support structure supporting the plurality of LEEs in the array and including electronic circuitry designed and configured for electrically connecting the plurality of pixels to an image driver that, when present and operating, drives the plurality of pixels so that the visual-display structure displays at least a portion of an image; and a contrast enhancer coupled to the support structure and present in the inter-LEE spaces between adjacent ones of the plurality of LEEs, wherein the contrast enhancer comprises a metal sheet containing a plurality of openings corresponding to ones of the plurality of LEEs.

In another implementation, the present disclosure is directed to a method of making a visual-display structure. The method includes providing a circuit board comprising a plurality of light-emitting-package receivers arranged in an array to create a plurality of pixels, wherein the circuit board includes electronic circuitry designed and configured for electrically connecting the plurality of pixels to an image driver that, when present and operating, drives the plurality of pixels so that the visual-display structure displays at least a portion of an image; securing a plurality of light-emitting packages to the circuit board correspondingly and respectively at the plurality of light-emitting package receivers so that the plurality of light-emitting packages are spaced from one another to form inter-package spacing between adjacent ones of the plurality of light-emitting packages; electrically connecting each of the plurality of light-emitting packages to the electronic circuitry; providing a contrast enhancer that comprises a metal sheet containing a plurality of openings corresponding to the plurality of light-emitting packages secured to the plurality of light-emitting package receivers; and coupling the contrast enhancer to the circuit board so that portions of the contrast enhancer are located in the inter-package spacing.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1A:
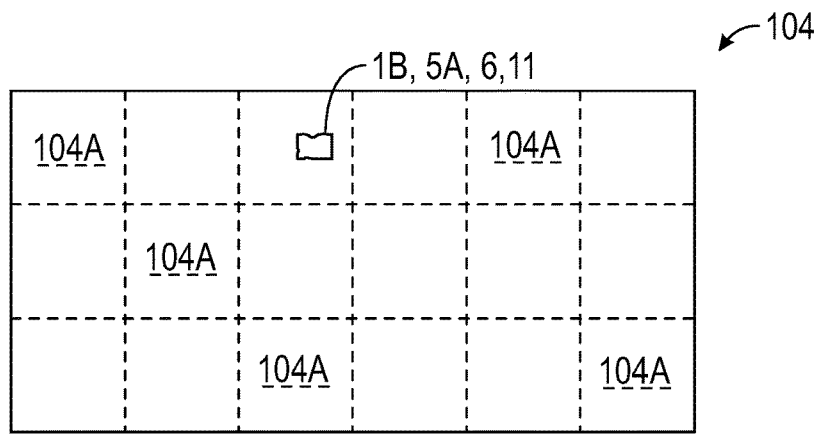
FIG. 1A is an elevational front view of a visual display made in accordance with aspects of the present invention.
Figure 1B:
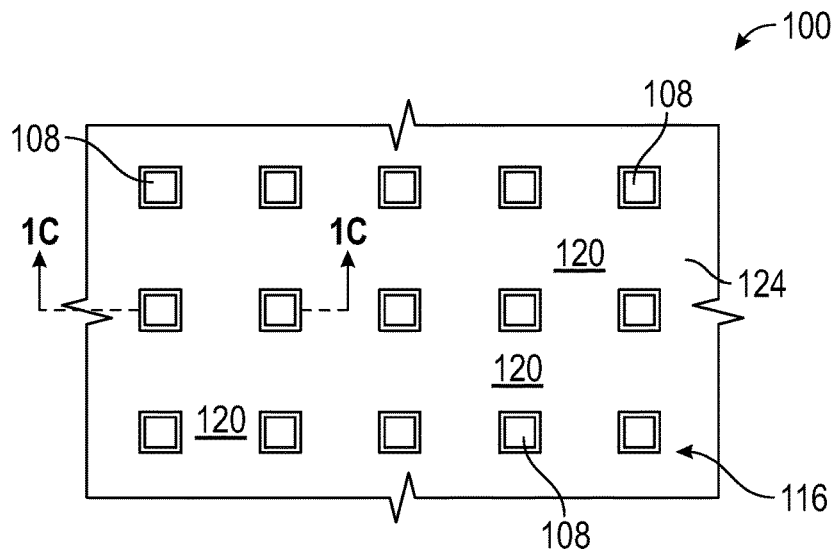
FIG. 1B is an enlarged front view of portion 1B of the visual display of FIG. 1A.
Figure 1C:
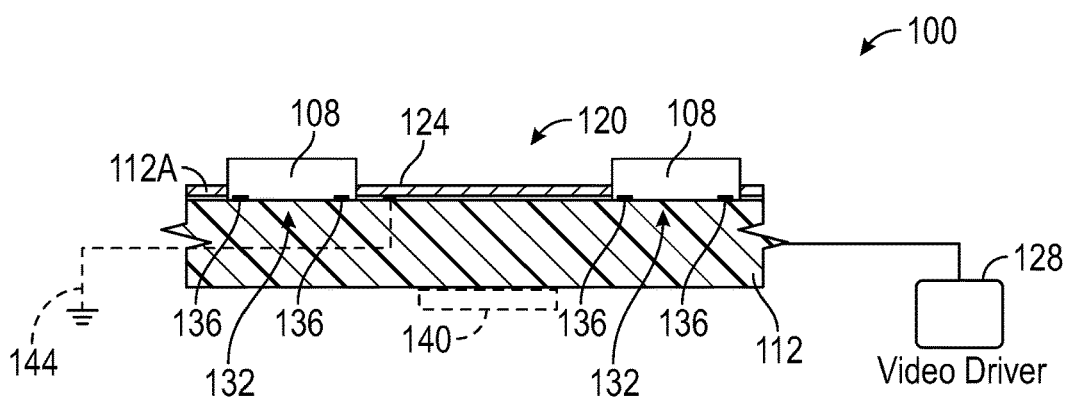
FIG. 1C is a diagram that includes an enlarged cross-sectional view as taken along line 1C-1C of FIG. 1B.

In some aspects, and referring to FIG. 1, the present disclosure is directed to visual-display structures for a visual display 104 (FIG. 1A) that can, for example, be a flat-panel or curved-panel display for displaying dynamic images (e.g., video) and/or static images. Referring first to FIGS. 1B and 1C, these figures show an example display structure 100 that is composed of multiple discrete light-emitting packages 108 (only a few labeled to avoid clutter) mounted to an underlying support structure 112 (e.g., a printed circuit board (PCB); internal circuitry generally not shown) in a spaced-apart manner to form an array 116 of light-emitting elements (LEEs) that form a pixel array of visual display 104. In visual display 104, light-emitting packages 108 are spaced from one another to form inter-package spaces 120 (FIGS. 1B and 1C) that, if left uncovered, would expose portions of support structure 112 to view from the viewing side of the visual display. As noted in the Background section above, leaving portions of support structure 112 in inter-package spaces 120 exposed to view can be detrimental to the image quality of visual display 104.

To combat this, display structure 100 includes a contrast enhancer 124 composed of a metal sheet that has been modified in one or more ways (such as described below) to become the contrast enhancer. It is noted that the term "sheet" as used herein and in the appended claims covers foils and plates and any form having a relatively small thickness compared to the other two dimensions (e.g., width and height) of the sheet. It is further noted that a "sheet" in the context of the present disclosure and appended claims does not need to be flat. For example, a sheet may have curvature or other out-of-plane shape in one or more directions. Those skilled in the art will readily be able to distinguish the meaning of "sheet" from the context disclosed herein. Contrast enhancer 124 can provide one or more functions in addition or alternatively to providing contrast enhancement. For example, contrast enhancer 124 can be part of a planar-type loudspeaker, can be part of a touch sensor for providing display structure 100 with a user interface (UI), can support one or more components of a touch sensor, and/or can provide the display structure with a unique look, such as when including one or more graphical elements. Each of these functions is described below in detail. In addition, due to its metal construction, contrast enhancer 124 can assist in making display structure 100 more fire resistant than conventional display structures, such as display structures having plastic contrast enhancers. Thus, adding a contrast enhancer, such as contrast enhancer 124, can help the visual display at issue to better comply with any applicable fire codes.

Display structure 100 can be embodied into visual display 104 (FIG. 1A) in any suitable manner. For example, visual display 104 may be a monolithic display device, with support structure 112 being a single circuit board spanning the entire width and height (assuming the visual display is vertically mounted), in which case display structure 100 covers the entire display device. As another example, visual display 104 may be a mosaicked display composed of a plurality of display tiles 104A (FIG. 1A; only a few labeled to avoid clutter), with support structure 112 spanning only a single display tile. In this case, display structure 100 covers only a single display tile 104A, with multiple instances of such a display tile or similar display tiles being placed relative to one another and electrically connected so as to form overall visual display 104.

Each light-emitting package 108 may be any suitable light-emitting package, such as a light-emitting-diode (LED) based package. Each light-emitting package 108 may alternatively be based on any other suitable technology, such as laser-diode technology, among others. Depending on the design of visual display 104, each light-emitting package 108 may form a single pixel (e.g., include red, green, blue, and white LEEs), may form multiple pixels, or may form a portion of a pixel (e.g., include only one or more red LEEs, include only one or more green LEEs, include only one or more blue LEEs, or include one or more white LEEs). Each light-emitting package 108 may be a surface mount device (SMD) that mounts to surface 112A of support structure 112 (e.g., a PCB). Technologies other than SMD technology, such as dual in-line package (DIP) technology, chip on board (COB) technology, and multiple chip on board (MCOB) technology, among others, can be used if desired. Fundamentally, there is no limitation on how light-emitting packages 108 are mounted to support structure 112 as long as the light-emitting packages are mounted so that inter-package spaces 120 are present.

In some embodiments, the package pitch (horizontal, vertical, or both (as viewed when visual display 104 is oriented vertically)) of light-emitting packages 108 is below 2 mm, such as in a range of 2 mm to 1 mm or in a range of 0.8 mm to 0.6 mm. That said, the package pitch may be greater than 2 mm or less than 0.6 mm. Fundamentally, there is no limitation on package pitch other than practicality. In some embodiments, the size of each light-emitting package 108 ranges from 0.3 mm square to 1 mm square and have a height from 0.1 mm to 1 mm. However, the size of each light-emitting package 108 can be smaller than 0.3 mm square or larger than 1 mm square and have a height smaller than 0.1 mm or larger than 1 mm, depending on a particular design. Each light-emitting package may have shapes other than square, such as circular and oblong, among others.

Support structure 112 may be any type of structure, for example a circuit board, that provides the proper electrical connectivity between light-emitting packages 108 and an image driver 128, such as a video driver or static image driver. As those skilled in the art will readily appreciate, such electrical connectivity may include "printed" wires or electrical traces (not shown) that extend from a suitable connection point (not shown) to each of a plurality of package receivers 132 to which light-emitting packages are electrically connected, for example, using solder 136. As described below, support structure 112 may include one or more additional features relating to contrast enhancer 124, not to mention any other features typically included in similar support structures.

In the example shown in FIG. 1C, contrast enhancer 124 is shown as being in direct contact with support structure 112. However, in other embodiments, contrast enhancer 124 can be spaced from support structure 112. For example, if light-emitting packages 108 emit light from their lateral sides, it may be desirable to space contrast enhancer 124 from surface 112A of support structure 112 to block some or all of such side-emitted light. In such embodiments, the spacing between contrast enhancer 124 and support structure 112 can be effected in any suitable manner, such as by adding spacers (not shown) to the underside of contrast enhancer 124 and/or adding spacers to the surface of the support structure. In either case and in many applications, a benefit of contrast enhancer 124 is that it provides protection to support structure 112, and to varying extent light-emitting packages 108 depending on their structure, such as abrasion protection and impact protection, even if any of light-emitting packages 108 is damaged.

Figure 2A:
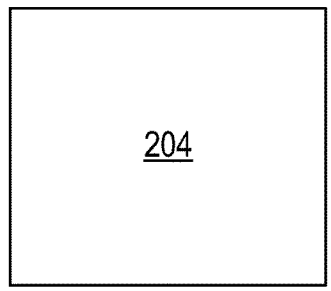
FIG. 2A is a plan view of a metal sheet prior to fabrication into a contrast enhancer.

As noted above, contrast enhancer 124 may be made of a metal sheet that has been appropriately modified to provide the desired functionality. FIGS. 2A to 2D illustrate an example of how a contrast enhancer 200, 200' (FIGS. 2C and 2D, respectively) may be made. As seen in FIG. 2A, either contrast enhancer 200, 200' may start as a plain metal sheet 204, which may be a sheet of any suitable metal, such as stainless steel or aluminum, among many others. Metal sheet 204 may be cut to a suitable size, such as to match the size of an entire monolithic visual display (not shown), a portion of the monolithic visual display, or to match the size of a display tile, or portion thereof, for a mosaicked display (not shown). It is also noted that while contrast enhancer 200, 200' is shown as being square, the overall shape of a contrast enhancer, or portion thereof, made in accordance with the present disclosure can be any shape desired. Examples of shapes other than square include, but are not limited to, circular, hexagonal, triangular, wavy, oblong, annular, and elliptical, among others. Fundamentally, there is no limitation on the overall shape of a contrast enhancer of the present disclosure. In some cases, the contrast enhancers can be used to form patterns on the viewing side of a visual display. For example, multiple contrast enhancer panels can include differing treatments having differing visual characteristics, such that when they are assembled into a full contrast enhancer and applied to a visual display, they provide a desired visual pattern when the visual display is not operating.

Figure 2B:
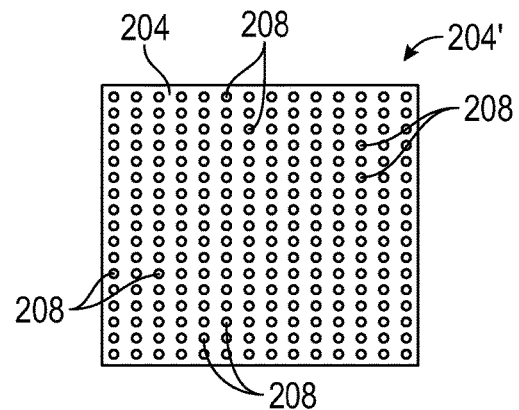
FIG. 2B is a plan view of the metal sheet of FIG. 2A after forming openings corresponding to the light-emitting elements.

FIG. 2B illustrates metal sheet 204 after forming openings 208 (only a few labeled to avoid clutter) to create an apertured metal sheet 204'. Openings 208 are sized and located to correspond to the size and spacing of the light-emitting packages (or more generally LEEs), such as light-emitting packages 108 of FIGS. 1B and 1C, so that when contrast enhancer 200, 200' (FIGS. 2C and 2D) is applied to a support structure, such as support structure 112 of FIG. 1C, each light-emitting package will extend through a corresponding opening. In this manner, the portions of apertured metal sheet 204' surrounding openings 208 substantially fill the inter-package spaces, such as inter-package spaces 120 of FIGS. 1B and 1C, to hide the underlying printed circuit board, and its suboptimal contrast-enhancing qualities, from view.

Each opening may be formed in any suitable manner, such as chemical etching, punching, laser cutting, etc. In some embodiments, metal sheet 204 may have a thickness in a range of 0.1 mm to 0.4 mm and the greatest dimension of each opening 208 may be on the order of, for example, 0.2 mm to 1 mm. In such size regimes and smaller, chemical etching may be a preferred process for forming openings 208 with the necessary precision and accuracy. It is noted that the foregoing thickness examples are merely illustrative and that other thicknesses may be used depending upon the particular application. For example, for smaller LEDs, thicknesses less than 0.1 mm may be needed to avoid contrast enhancer 200, 200' (FIGS. 2C and 2D) creating color shifting. Chemical etching of metals is well known, and those skilled in the art will readily understand the steps, such as masking, etchant application, mask removal, and cleaning, necessary to effect high-quality chemically etched openings 208. Regarding the shape and size of each opening 208 relative to the corresponding light-emitting package, each opening may be shaped to conform to the lateral perimeter of the light-emitting package and may be sized to provide a small gap, such as a gap on the order of 0.15 mm to 0.01 mm, between the surrounding portions of apertured metal sheet 204' and the light-emitting package. The size of each opening 208 is generally limited only by the size of the light-emitting package that that opening will receive when contrast enhancer 200, 200' (FIGS. 2C and 2D) is installed in a visual display. If apertured metal sheet 204' is to be coated with a treatment (see below) after openings 208 have been formed, the thickness of such coating(s) needs to be taken into consideration when sizing the openings if the coating(s) will decrease the size of each opening.

While example sheet thickness and opening size regimes are provided above, those skilled in the art will readily appreciate that the only limitation on sheet thickness and/or opening size is practicality compared to other contrast enhancer technologies. Using metal sheet 204 for contrast enhancer 200, 200' can be particularly advantageous for the example size regime detailed above relative to FIGS. 1B and 1C because of the relatively high strength-to-thickness ratio of metals such as stainless steel, among others, which allows the contrast enhancer to remain flat or at a desired curvature during handling and application to support structure 112. When the heights of light-emitting packages 108 is relatively small (e.g., on the order of 0.3 mm to 0.8 mm), metal sheet 204 can result in the thickness of contrast enhancer 200, 200' being kept very low so that it does not block the light emitting from the low-height light-emitting packages and hence not influence, locally (patterns due to inconsistencies) or globally, the light output of the light-emitting packages. In addition, due to the flatness and contrast enhancer 200, 200' being below the light-emitting surface of each light-emitting package, color shift is also avoided. Color shift can be a big drawback of existing contrast-enhancing elements. In addition, metal is particularly amenable to the precision etching needed for creating openings 208 at the scale of these size regimes.

Figure 2C:
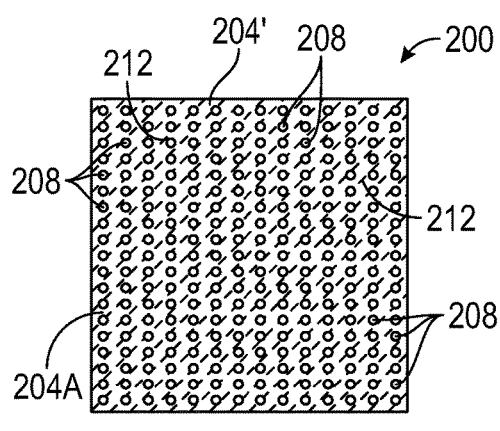
FIG. 2C is a plan view of the metal sheet of FIG. 2B after treating the front-facing surface of the metal sheet to improve its contrast-enhancing ability.

FIG. 2C illustrates apertured metal sheet 204' after at least front-facing surface 204A of the apertured metal sheet has received a treatment 212 to enhance its contrast-enhancing abilities. Examples of treatments that can be used for treatment 212 include treatments that absorb light and/or reduce reflection, such as, but not limited to, black paint (e.g., extreme blacks) and other coatings (e.g., carbon nanotube-based coatings and oxide coatings), anodizing, and chemical blackening, among others. It is noted that adhesion of paint materials is generally much easier and more robust compared to paint applied to plastics, and options for blackening are more numerous than for plastics conventionally used for shaders for visual displays. After application of treatment 212 and after performing any other desired processing steps, metal sheet 204' may now be considered contrast enhancer 200 and may now be ready for application to a printed circuit board. Depending on design considerations, treatment 212 applied to front-facing surface 204A may be applied before or after forming openings 208 and/or may also be applied to the back-facing surface (not seen) of contrast enhancer 200. Examples of additional processing steps include, but are not limited to, adding additional structures, such as spacers (not shown) on the back-facing surface (not seen) to increase the spacing of front-facing surface 204A of contrast enhancer 200 from the underlying support structure (e.g., to occlude any light that may exit the light-emitting packages from their sides) and adding louvers for shading the light-emitting packages, adding an adhesive backing, and adding electrical insulation (e.g., around openings 208 to electrically insulate the contrast enhancer from the light-emitting packages or over the entire back-facing surface), among others. Additional structural features can be added using any suitable techniques, such as 3D printing and adhesive bonding, among others. The order in which various steps of forming contrast enhancer 200 or an embellished version thereof, need not be as described above but rather may be in any suitable order.

Figure 2D:
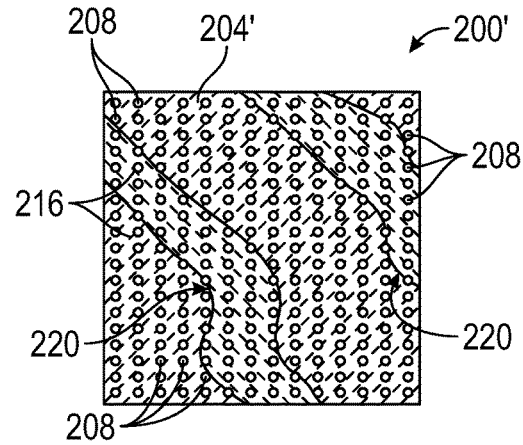
FIG. 2D is a plan view of the metal sheet of FIG. 2B after treating the front-facing surface of the metal sheet to include graphics.

FIG. 2D illustrates an example of an alternative contrast enhancer 200' in which uniform contrast-enhancing treatment 212 on front-facing surface 204A of contrast enhancer 200 of FIG. 2C is replaced with a treatment 216 that includes one or more graphical elements 220 that a viewer can discern when the visual display to which contrast enhancer 200' is applied is not energized. Graphical element(s) 220 can be any suitable graphical element(s), such as a picture (or a portion of a picture), a logo (or a portion of a logo), or a watermark (or a portion of a watermark), among many other things. Graphical element(s) 220 can be applied in any suitable manner, such as by silk screening, inkjet printing, etching, press printing, and embossing, among many others. Graphical element(s) 220 may be executed using any suitable color scheme and using more than one color. Other aspects of contrast enhancer 200' may be the same as or similar to like aspects of contrast enhancer 200 of FIG. 2C.

Referring again to FIGS. 1B and 1C, if contrast enhancer 124 is ferromagnetic, it can be held into contact with one or more optional magnets 140 that can be embedded in, applied to, or otherwise in functional engagement with support structure 112, such as by attraction to the contrast enhancer. Holding contrast enhancer 124 in place using magnetic attraction allows the contrast enhancer, for example, to be readily replaced if damaged or to be removed and reinstalled, such as when replacing a burned-out light-emitting package. Those skilled in the art will understand how to design, locate, and/or arrange the magnet(s) 140 to optimize the magnetic attraction between the magnet(s) and contrast enhancer 124.

In addition to the benefits of having contrast enhancer 124 made from a metal sheet as described above, using a metal sheet can provide additional benefits. For example, it is well known that LED packages can be damaged by electrostatic discharge (ESD) caused, for example, by someone handling a device that includes such packages without proper ESD protection. This damage can result in dead pixels and dead colors in a visual display, such as visual display 104 of FIGS. 1A and 1B. In some embodiments, contrast enhancer 124 can provide ESD protection by providing grounding circuitry 144 and electrically connecting the contrast enhancer to the grounding circuitry. Grounding circuitry 144 can be incorporated in any suitable manner, such as by routing it through support structure 112 or routing it externally relative to the support structure. Those skilled in the art will readily understand how to implement grounding circuitry 144 and make the necessary electrical connections to contrast enhancer 124 to allow the contrast enhancer to function as ESD protection. Grounding circuitry 144 may be circuitry already aboard support structure 112 or may be circuitry specifically added to enable ESD protection via contrast enhancer 124.

As another example of a benefit flowing from contrast enhancer 124 being made of a metal sheet is the ability of the contrast enhancer to provide electromagnetic interference (EMI) shielding. To comply to EMI regulations, special circuitry design and signal tuning must happen on support structures, such as a circuit board that is part of support structure 112 of FIG. 1C. However, this has its limits because circuit boards often contain vias and the leads of the light-emitting packages are often on top of the circuit board, and all of these features act as antennas for emitting high-frequency electronic fields. A metal-sheet-based contrast enhancer, such as contrast enhancer 124 of FIGS. 1B and 1C, can contribute significantly to reduce such emissions. By connecting contrast enhancer 124 to grounding circuitry 144 and not providing any interfering coating on the face of the contrast enhancer facing surface 112A of support structure 112, it can act as an electromagnetic shield to reduce emissions of the high-frequency fields noted above.

As a further example of a benefit flowing from contrast enhancer 124 being made of a high-thermal-conductivity metal sheet is that the contrast enhancer can provide meaningful heat-sinking ability. As is well known in the industry, heat management of LEDs and other solid-state light-emitting devices is very important, not only for lifetime, but also for color consistency. Local heat differences and/or higher temperatures can have a severe impact on accurate color reproduction of the devices. Thermal conductivity of metal is generally an order of magnitude higher than the thermal conductivity of most plastics (unless very expensive compounds are used.) Consequently, providing a good thermal pathway from contrast enhancer 124 to an external heat sink (not shown) such as through support structure 112, can allow the contrast enhancer to act as an additional heat sink and heat spreader. For example, contrast enhancer 124 can be thermally connected with support structure 112 via solder bumps on top of the circuit board.

Figure 3:
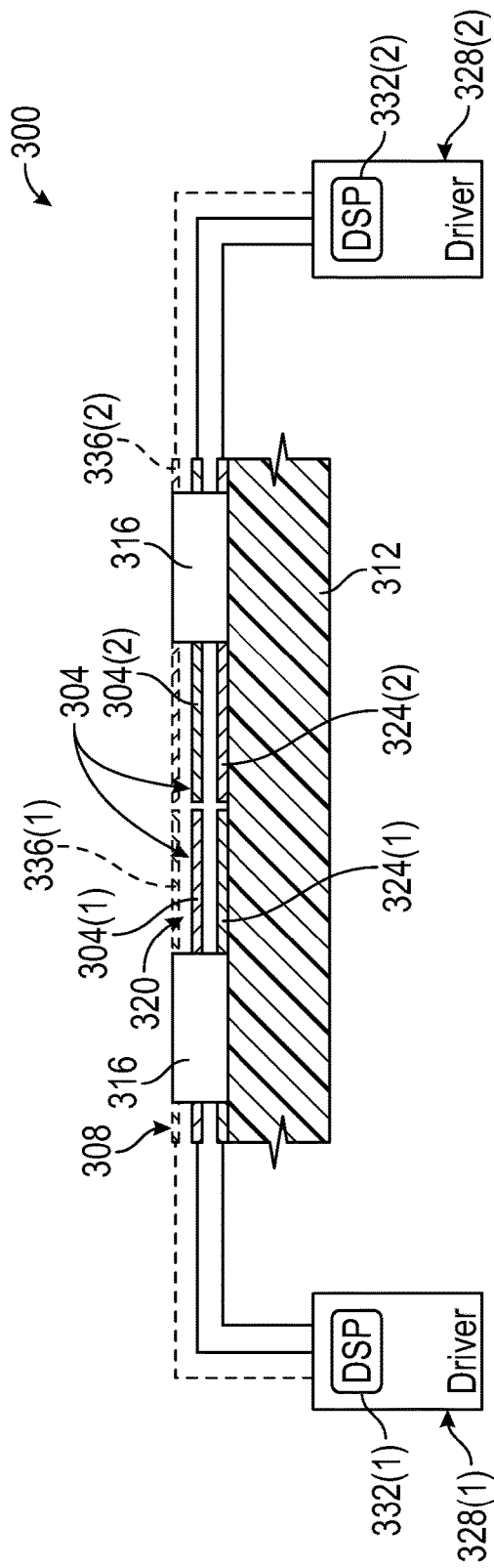
FIG. 3 is a diagram that includes a cross-sectional view of a visual-display structure having an integrated loudspeaker system.

FIG. 3 illustrates an alternative visual-display structure 300 for a visual display, such as visual display 104 of FIG. 1A. In this example, display structure 300 includes a contrast enhancer 304 and an integrated loudspeaker 308 that is composed in part of the contrast enhancer. For the sake of completeness, it is noted that display structure 300 shown in FIG. 3 is similar to display structure 100 as depicted in FIG. 1C in that display structure 300 relates to visual display 104 of FIG. 1A and aspects of display structure 100 as depicted in FIG. 1B in the same manner that display structure 100 of FIG. 1C relates to the structures depicted in FIGS. 1A and 1B. Indeed, display structure 300 of FIG. 3 can replace display structure 100 of FIGS. 1A to 1C.

Referring to FIG. 3, display structure 300 includes a circuit board 312 and a plurality of light-emitting packages 316 secured to the circuit board in any suitable manner so as to provide inter-package spaces 320 occupied by portions of contrast enhancer 304. Circuit board 312 and light-emitting packages 316 can be the same as or similar to support structure 112 and light-emitting packages 108 of FIGS. 1A to 1C, and contrast enhancer 304 can provide the same functionality and have the same or similar structure as contrast enhancer 124 described above. Contrast enhancer 304 is partitioned into at least two discrete panels 304(1) and 304(2) that can be driven separately from one another in a manner that causes the contrast enhancer to produce audible sound. In this case, each discrete contrast enhancer panel 304(1), 304(2) may be considered a diaphragm of an ultrasonically driven loudspeaker.

Briefly, ultrasonic loudspeakers work on the known physical principle that when two sound waves of differing frequencies propagate simultaneously through the same medium, the sound waves parametrically interact with one another to produce a modulated waveform that includes the sum and difference of the two frequencies. When the frequency difference between two ultrasonic frequencies is an audible frequency, the modulated waveform will produce audible sound of that frequency. Ultrasonic audio systems and design considerations for such systems are well known. See, for example, U.S. Pat. No. 9,432,785 to Kappus et al. and titled "ERROR CORRECTION FOR ULTRASONIC AUDIO SYSTEMS", which is incorporated herein by reference for information about ultrasonic audio systems.

In one example, each contrast enhancer panel 304(1), 304(2) is made from a metal sheet and is driven by at least one corresponding stator 324(1), 324(2), which may be applied to circuit board 312. Stators 324(1) and 324(2), in turn, are driven by corresponding respective drivers 328(1) and 328(2) that simultaneously drive the stators, respectively, at differing ultrasonic frequencies separated by a desired audio frequency. Each driver 328(1), 328(2) includes a digital signal processor (DSP) 332(1), 332(2) adjusted to tune the performance of the corresponding contrast enhancer panel 304(1), 304(2) to optimize the quality of the audible sound generated by loudspeaker 308. By using DSPs 332(1) and 332(2), harmonic distortion previously associated with using a single stator to drive a diaphragm can be minimized or even be compensated for. However, in some embodiments an optional second set of stators 336(1) and 336(2), one for each contrast enhancer panel 304(1), 304(2), can be used to, among other things, minimize harmonic distortion. Second set of stators 336(1) and 336(2) are generally driven 180° out of phase relative to stators 324(1) and 324(2), for example using a suitable delay means (not shown), such as a digital delay or physical delay element. If a second set of stators 336(1) and 336(2) is provided, in order for contrast enhancer 304 to provide its contrast enhancing functionality each stator 336(1), 336(2) must be transparent and include a transparent conducting film (e.g., indium tin oxide (ITO)) so that it can be driven as a stator. Although not shown, each contrast enhancer panel 304(1), 304(2) may be held in a taught state and in spaced relation to the corresponding stator 324(1), 324(2) by any suitable means, such as supports along edges and/or at corners of each contrast-enhancer panel.

Figure 4:
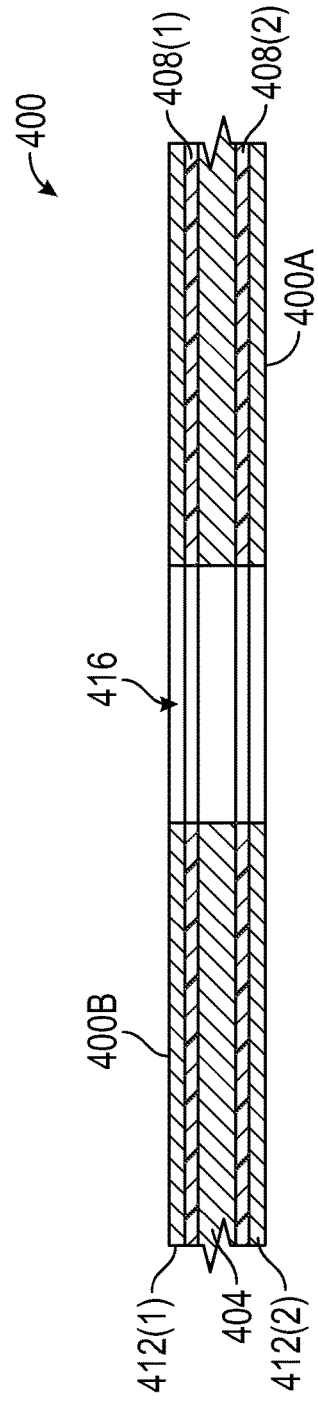
FIG. 4 is an enlarged cross-sectional view of a portion of a contrast-enhancer panel that can be used in place of each of the two contrast enhancer panels of the visual-display structure of FIG. 3.

FIG. 3 illustrates contrast enhancer panels 304(1) and 304(2) acting as a diaphragm of loudspeaker 308 and being in spaced relation to circuit board 312 and stators 324(1) and 324(2). Depending on the ultrasonic frequencies used, the diaphragm can be monolithically integrated with circuit board 312. FIG. 4 shows an example contrast enhancer 400 that can be used to replace each of contrast enhancer panels 304(1) and 304(2) of FIG. 3. Referring to FIG. 4, contrast enhancer 400 includes a metal sheet 404. An electrically insulating layer 408(1), 408(2), such as mylar, PVC, and polymer composite materials, among others, is provided on each side of metal sheet 404. Then, an electrically conductive layer 412(1), 412(2), such as ITO coating on mylar, copper/metal vapor deposition, and polymer conductive layers, among others, is provided over the corresponding electrically insulating layer 408(1), 408(2) so as to form a sandwich, with metal sheet 404 as the middle layer of the sandwich and acting as the diaphragm. The circuit-board-facing side 400A of contrast enhancer 400 may then be firmly secured to circuit board 312 (FIG. 3), for example, via adhesive or other type of bonding, in inter-package spaces 320 so as to effectively be monolithic with the circuit board. When conductive layers 412(1) and 412(2) are suitably driven, they function as stators, and the resulting electric fields cause metal sheet 404 and layers on top to vibrate at the desired ultrasonic frequency. The viewer-facing side 400B of contrast enhancer 400 may be treated to increase contrast, for example, using any of the treatments described above relative to contrast enhancer 124 of FIGS. 1B and 1C. In the portion of contrast enhancer 400 shown, only a single package opening 416 is shown for receiving a light-emitting package, such as either of light-emitting packages 316 of FIG. 3.

It is noted that the foregoing example loudspeaker constructions illustrated in FIGS. 3 and 4 involve a contrast enhancer panel acting as a diaphragm of a loudspeaker. However, the diaphragm need not be a contrast enhancer, nor does it necessarily need to be made from a sheet of metal. In some embodiments, the sole function of the component used as the diaphragm could be to act as a loudspeaker diaphragm, with the only physical similarity being that the component include openings for the purposes disclosed herein, such as receiving discrete light-emitting packages or providing unobstructed views of pixels or pixel elements located in a plane lying beneath the plane of the diaphragm. As an example of a non-metal-sheet based diaphragm, the diaphragm could be a polymer film coated with a conductive layer, which could be a transparent conductive layer or an opaque conductive layer. These alternatives are equally applicable to visual displays based on package-type technology and visual displays based on non-package-type technology.

By integrating a loudspeaker system into a visual display, such as using visual-display structure 300 of FIG. 3 with or without contrast enhancer 400 of FIG. 4, up to the total area of the display can be made to act as one single emitter. Alternatively, the visual display can be partitioned into multiple different emission sources, thereby creating an immersive visual display and sound environment. In this manner, for example, visual displays, such as LED-based displays, can be used as movie theater screens to replace projection screens that currently have speakers placed behind them. Many other implementations are possible.

Figure 5A:
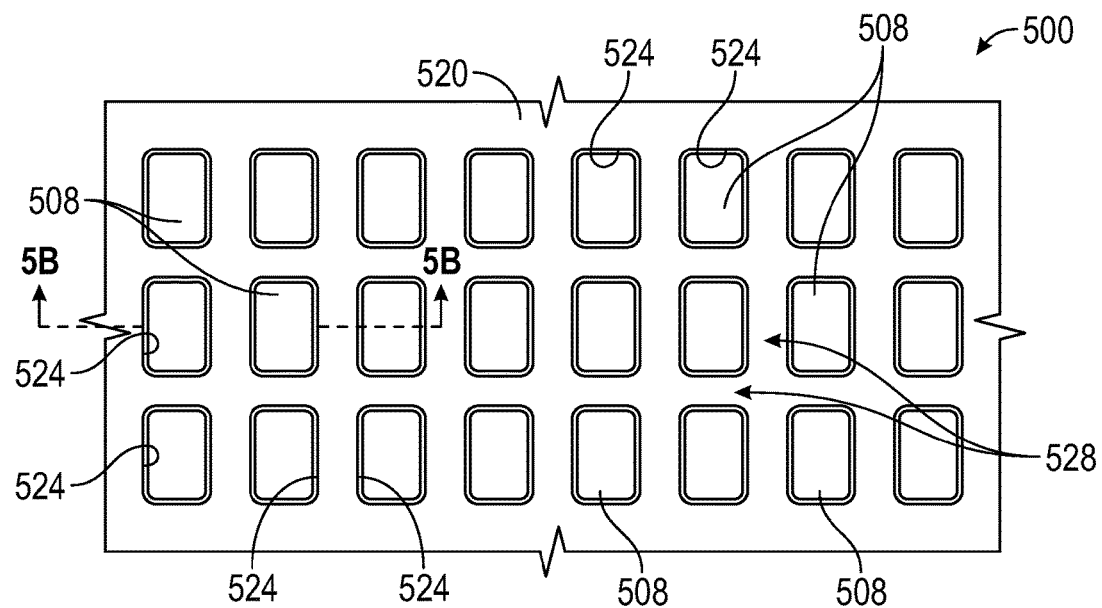
FIG. 5A is an enlarged front view of portion 5A of the visual display of FIG. 1A.
Figure 5B:
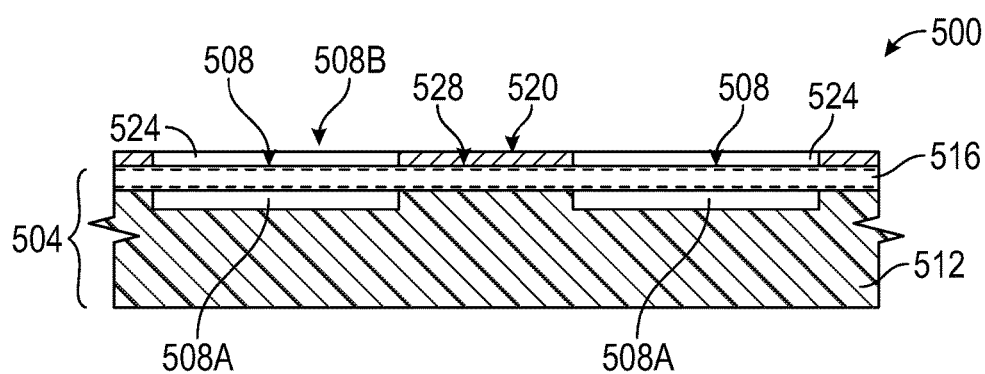
FIG. 5B is an enlarged cross-sectional view as taken along line 5B-5B of FIG. 5A.

Whereas the foregoing examples of contrast enhancers are directed to flat-panel displays composed of discrete light-emitting packages that are surface-mounted to a circuit board or otherwise protrude above the front surface of the circuit board, the use of a metal-sheet-based contrast enhancer of the present disclosure is not so limited. For example, an apertured contrast enhancer similar to the contrast enhancers described above can be applied over any non-package-based visual display, such as an LCD display, OLED display, and micro-LED display. In any of these cases, the openings formed in the metal sheet, such as by etching, correspond to the locations of light-emitting elements (LEEs) that form the pixels or subpixels of the display. FIGS. 5A and 5B illustrate an example visual-display structure 500 that can be used, for example, for visual display 104 of FIG. 1A and that is composed of a non-package-based display component 504 containing a plurality of LEEs 508 (only a few labeled to avoid clutter). Each LEE 508 may be any suitable LEE, such as an LCD-based LEE, a micro-LED, an OLED, a plasma cell, and a laser diode, among others. Fundamentally, there is no limitation on the type of each LEE 508. Depending on its type and composition of display structure 500, each LEE 508 may form an entire pixel or form a subpixel. In this example, LEEs are formed integrally within display component 504, for example, using any suitable technology, such as conventional flat-panel display fabrication technology, among others.

Display component 504 includes a support structure 512 FIG. 5B) that contains the necessary circuitry (not shown) used in controlling one or more subcomponents (not shown), such as a direct-emitting element (e.g., LED, laser diode, plasma cell) or a backlighting element (e.g., LCD element). Display component 504 may optionally include one or more layers 516 providing any one or more of a variety of functions for controlling the output of light from each LEE 508. Examples of such layer(s) 516 include, but are not limited to, color filter layer(s) and an LCD layer, among others. In this example, each LEE 508 includes a direct-emitting element 508A that generates light for that LEE. It is noted, however, that with some display technologies, such as LCD technologies, there does not need to be a one-to-one correspondence between direct-emitting elements 508A and LEEs 508.

Display structure 500 further includes a metal-sheet-based contrast enhancer 520, which may be the same as or similar to any of the metal-sheet-based contrast enhancers described above. Accordingly, all aspects applicable to contrast enhancers of the present disclosure described above, including fabrication techniques, surface treatments, application techniques, and additional structures, are applicable to contrast enhancer 520. Contrast enhancer 520 includes a plurality of openings 524 that expose the light-emitting regions 508B of LEEs 508, with the portions of the contrast enhancer between the openings covering the inter-LEE spaces 528. It is noted that for display structures having finely pitched LEEs 508, etching techniques can be used to make the size and locating of openings 524 highly precise and accurate.

Figure 6:
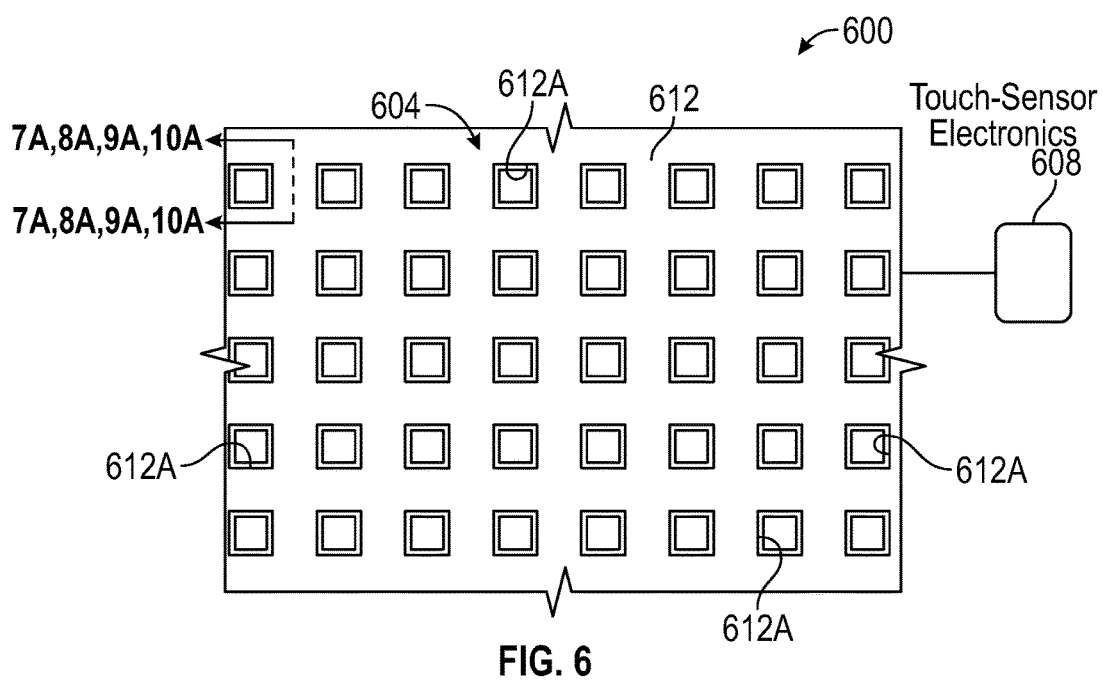
FIG. 6 is a diagram that includes an enlarged front view of portion 6 of the visual display of FIG. 1A, illustrating that a contrast enhancer can be integrated into a touch sensor to make the visual display a touch-sensitive display.

FIG. 6 illustrates an alternative portion 600 (identified at "6" in FIG. 1A) of visual display 104 of FIG. 1A that has a touch sensor 604 and corresponding touch-sensor electronics 608 to provide the display with a user interface that allows a user to interact with the visual display in a similar manner to other touch devices, such as touchscreens of smartphones, tablet computers, desktop computers, stand-alone computer monitors, kiosks, and automated teller machines, among many other devices. As illustrated FIGS. 7A to 9B, touch sensor 604 and touch-sensor electronics 608 can be based on any suitable touch sensor technology, such as projected capacitive (FIGS. 7A and 7B), surface capacitive (FIGS. 8A and 8B), digital-type resistive (FIGS. 9A and 9B), and analog-type resistive (FIGS. 10A and 10B). A unique feature of touch sensor 604 using any of these technologies is the integration of an apertured contrast enhancer 612 as an element of the touch sensor. Those skilled in the art will readily understand how to design touch-sensor electronics 608 based on the touch-sensor technology being utilized. In addition, circuitry suitable for touch-sensor electronics 608 can be adapted from conventional applications.

When a touch sensor, such as touch sensor 604 is being utilized, visual display 104 (FIG. 1A) can have any suitable type of construction relative to the LEEs, including a package-based construction (see, e.g., FIG. 1B) in which the adjacent light-emitting packages (not shown) are spaced apart and extend into or through apertures 612A (only a few labeled) in contrast enhancer 612 (see, e.g., FIG. 5A) and a non-packaged-based construction (see. e.g., FIG. 5A) in which the adjacent LEEs (not shown) are present in a layer located beneath the contrast enhancer. In this case, apertures 612A in contrast enhancer 612 are provided so that light from the LEEs can pass through the contrast enhancer.

It is noted that contrast enhancer 612 may have any one or more of the features described above for other contrast enhancers of the present disclosure. These features include, but are not limited to, being made of metal, having one or more coatings and/or other treatments that absorb light, incorporating a design, watermark, or other marking(s), and being made using one or more etching techniques, among others.

Figure 7A:
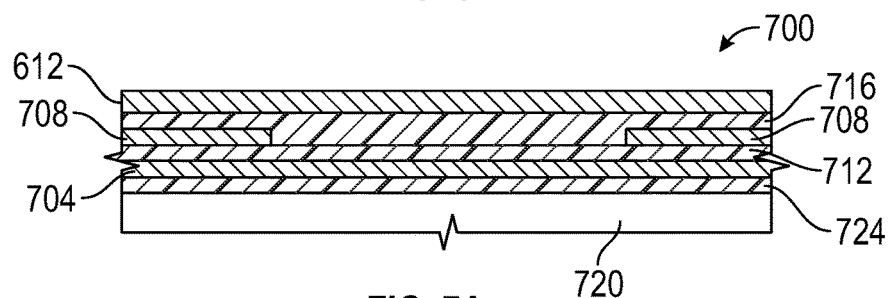
FIG. 7A is an enlarged cross-sectional view taken along line 7A-7A of FIG. 6, showing the touch sensor as being a projected capacitive touch sensor.
Figure 7B:
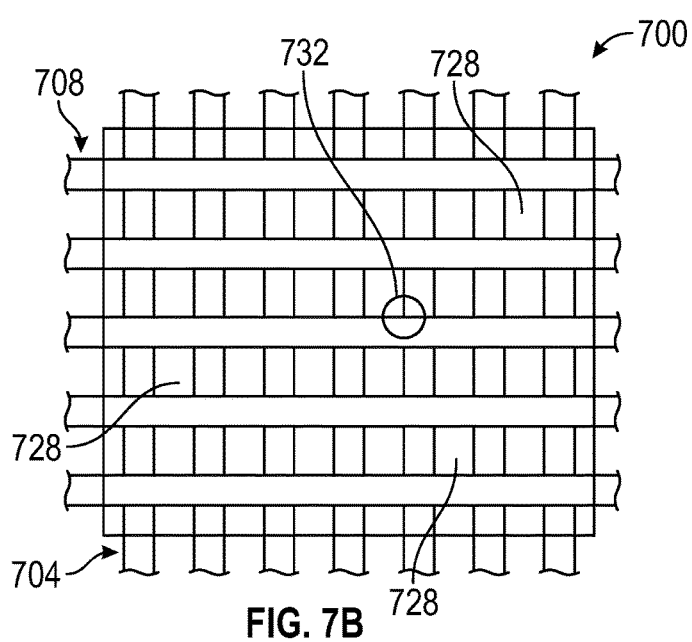
FIG. 7B is a reduced diagramatic view of a portion of the touch sensor of FIG. 7A, showing an example electrode layout for the projected capacitive touch sensor.

FIGS. 7A and 7B illustrate a projected capacitive touch sensor 700 that can be used for touch sensor 604 of FIG. 6. In one example, a set of x-direction electrical conductors 704 and a set of y-direction electrical conductors 708 are provided and are electrically insulated from one another by an insulating material 712, from contrast enhancer 612 by an insulating material 716, and from any interfering metal component(s), such as a PCB 720, by any suitable insulating material 724. It is noted that insulating materials 712, 716, and 724 can be the same as one another or may differ from one another. In some embodiments, x-direction and y-direction electrical conductors 704, 708 can match the grid pattern naturally inherent in contrast enhancer 612 by virtue of the array of openings 728 (only a few labeled) (FIG. 7B) formed thereby that correspond respectively to apertures 612A (FIG. 6) of contrast enhancer 612. x-direction electrical conductors 704 and y-direction electrical conductors 708 may be integrated solely onto PCB 720, solely onto contrast enhancer 612, split between the two (e.g., x-direction electrical conductors on one and y-direction electrical conductors on the other), and/or formed on one or more other layers (not shown). As those skilled in the art will readily appreciate, to determine the location of a touch by an electrically conductive element 732, for example, human finger, capacitive stylus, etc., touch-sensor electronics 608 (FIG. 6) may be configured to continually scan the grid of x-direction and y-direction electrical conductors 704, 708 and convert sensed changes in capacitances into screen coordinates for use by suitable user-interface (UI) software (not shown).

Figure 8A:
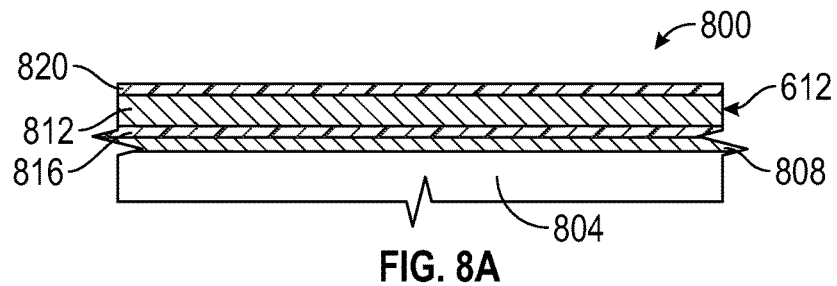
FIG. 8A is an enlarged partial cross-sectional view taken along line 8A-8A of FIG. 6, showing the touch sensor as being a surface capacitive touch sensor.
Figure 8B:
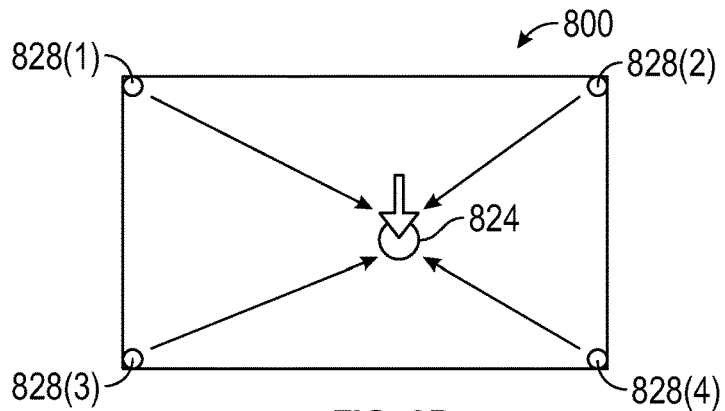
FIG. 8B is a reduced diagrammatic view of a portion of the touch sensor of FIG. 8A, showing an example electrode layout for the surface capacitive touch sensor.

FIGS. 8A and 8B illustrate a surface capacitive touch sensor 800 that can be used for touch sensor 604 of FIG. 6. In one example, a substrate 804 (e.g., a PCB), of display 100 (FIG. 1A) may include a first electrically conductive layer 808 and another layer, such as contrast enhancer 612, may include a second electrically conductive layer 812 that is electrically insulated from the first electrically conductive layer, for example by one or more insulating layers 816.

When contrast enhancer 612 itself is made from a sheet of metal, the contrast enhancer itself may provide second electrically conductive layer 812. At least one electrically insulating layer 820 is provided between second electrically conductive layer 812 and any electrically conductive element 824 (FIG. 8B) (e.g., human finger, capacitive stylus, etc.) used to interact with surface capacitive touch sensor 800. A number of electrodes, here electrodes 828(1) to 828(4) (FIG. 8B), are used to connect first and second electrically conductive layers 808, 812 to touch sensor electronics 608 (FIG. 6).

During operation, a voltage is applied between first and second electrically conductive layers 808, 812, for example, by touch sensor electronics 608. When electrically conductive element 824 touches electrically insulating layer 820, a capacitor is formed. Because of sheet resistance, when capacitance measurements are made at electrodes 828(1) to 828(4) (FIG. 8B), each measurement relates to the x-y position of electrically conductive element 824. Touch sensor electronics 608 uses the set of capacitance measurements from electrodes to determine the location of electrically conductive element 824 in screen coordinates and provides those coordinates to the pertinent UI software (not shown).

In many conventional surface capacitance touch sensors, the number of electrodes for taking measurements is generally limited due to the nature of the underlying display layer that makes it very difficult to deploy electrodes within the viewing area of the display. However, due to the grid-like nature of contrast enhancer 612 and its opacity, electrodes, such as electrodes 824, can be located at as many locations throughout the viewing area of display 100 as desired, since the electrodes and corresponding wiring will not be visible through the contrast enhancer. This can increase the accuracy of the touch functionality of surface capacitive touch sensor 800 over the accuracies achieved in conventional corner-only type surface capacitive touch sensors.

Figure 9A:
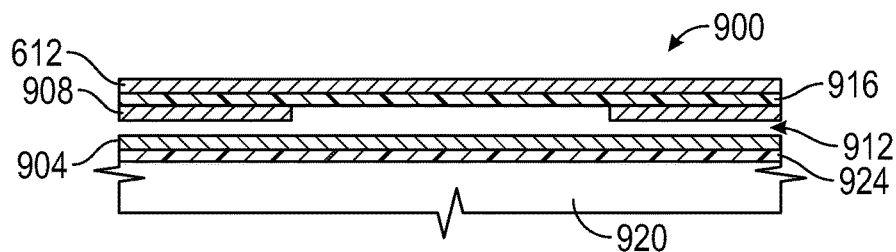
FIG. 9A is an enlarged partial cross-sectional view taken along line 9A-9A of FIG. 6, showing the touch sensor as being a digital-type resistive touch sensor.
Figure 9B:
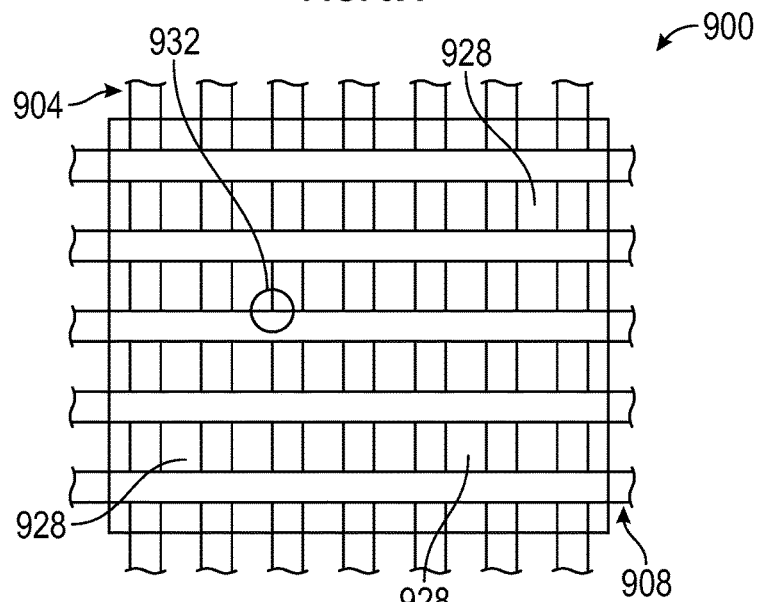
FIG. 9B is a reduced diagrammatic view of a portion of the touch sensor of FIG. 9A, showing an example electrode arrangement for the digital-type resistive touch sensor.
Figure 10A:
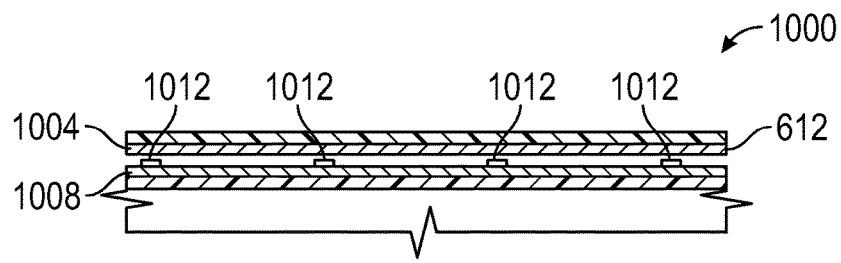
FIG. 10A is an enlarged partial cross-sectional view taken along line 10A-10A of FIG. 6, showing the touch sensor as being an analog-type resistive touch sensor.
Figure 10B:
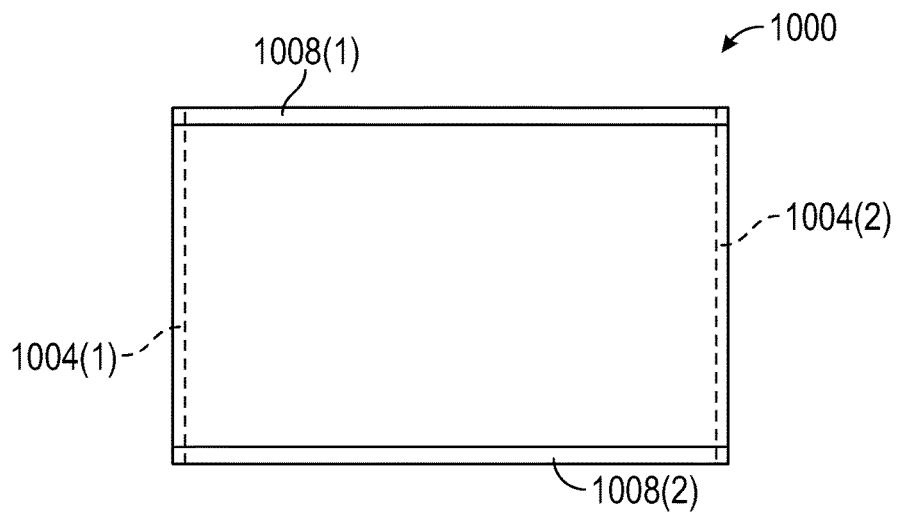
FIG. 10B is a reduced diagrammatic view of the touch sensor of FIG. 10A, showing an example electrode arrangement for the analog-type resistive touch sensor.

FIGS. 9A and 9B illustrate a resistive touch sensor 900 that can be used for touch sensor 604 of FIG. 6. In one example, a set of x-direction electrodes 904 and a set of y-direction electrodes 908 are provided and are spaced from one another by a gap 912. x-direction and y-direction electrodes 904, 908 are electrically insulated from contrast enhancer 612 by an insulating material 916, and from any interfering metal component(s), such as a PCB 920, by any suitable insulating material 924. It is noted that insulating materials 916 and 924 can be the same as one another or may differ from one another. In some embodiments, x-direction and y-direction electrodes 904, 908 can match the grid pattern naturally inherent in contrast enhancer 612 by virtue of the array of openings 928 (only a few labeled) (FIG. 9B) formed thereby that correspond respectively to apertures 612A (FIG. 6) of contrast enhancer 612. In the example shown, x-direction electrodes 904 are integrated onto PCB 920, while y-direction electrodes 908 are integrated onto contrast enhancer 612, with gap 912 therebetween.

During operation, a voltage is applied between first and second sets of electrodes 904, 908, for example, by touch sensor electronics 608. When a user presses an object 932 against contrast enhancer 612, one or more of electrodes 904 contact one or more of electrodes 908, causing one or more points of electrical conduction and, hence, lower electrical resistance. Touch sensor electronics 608 is configured to monitor resistances of electrodes 904, 908 and, upon detecting lowered resistance(s), to determine the screen coordinates of the point(s) of electrical conduction. Touch sensor electronics 608 provides the screen coordinates to the pertinent UI software (not shown).

In alternative embodiments, resistive touch sensor 900 need not be of the "digital" type having individual electrodes 904, 908 arranged in a grid as illustrated in FIGS. 9A and 9B. For example, and as illustrated in FIGS. 10A and 10B, alternative embodiments may be of an "analog" type of resistive touch sensor 1000, with a pair of conductive sheets 1004 and 1008 that are spaced apart from one another. Conductive sheets 1004 and 1008 may be largely or entirely coextensive with one another and may include some sort of spacers 1012 that keep the conductive sheets spaced apart when pressure is not being applied to touch sensor 1000. In some embodiments, when contrast enhancer 612 is formed from a metal sheet, it may also function as one of conductive sheets 1004 and 1008, typically, though not necessarily, the outermost conductive sheet, here sheet 1004. With this arrangement, conductive sheet 1008 may be affixed to an underlying structure, such as a PCB.

As seen in FIG. 10B, each conductive sheet 1004, 1008 may include two electrodes 1004(1), 1004(2) and 1008(1) and 1008(2), with the electrodes on conductive sheet 1004 being at opposing ends of the conductive sheet along the x-direction and the electrodes on conductive sheet 1008 being at opposing ends of that conductive sheet along the y-direction. Electrodes 1004(1), 1004(2), 1008(1), and 1008(2) may be connected to touch sensor electronics 608 in any suitable manner, such as using a "four-wire" arrangement or an "eight-wire" arrangement, as is known in the art. Those skilled in the art will understand that the example of FIGS. 10A and 10B is merely illustrative and that other configurations can be used. For example, conductive sheets 1004 and 1008 may be connected using the known "five-wire" arrangement (not shown) in which one of the conductive sheets has a single electrode electrically connecting it to touch sensor electronics 608 and the other conductive sheet has four electrodes connecting it to the touch sensor electronics. Those skilled in the art will understand how to configure touch sensor electronics 608 to suit any chosen arrangement of electrodes.

Figure 11:
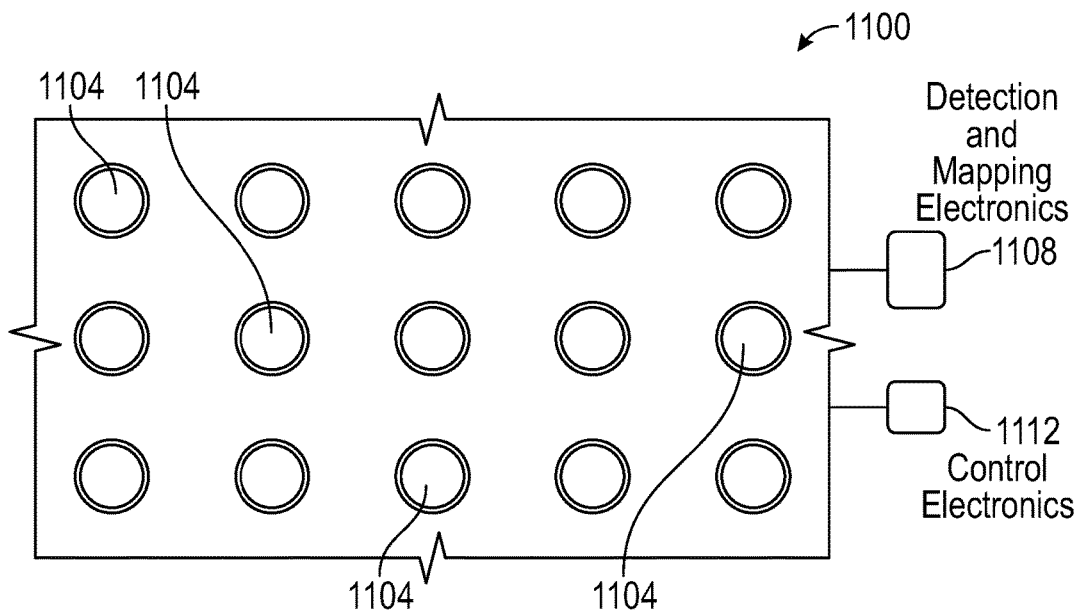
FIG. 11 is a diagram that includes an enlarged front view of portion 11 of the visual display of FIG. 1A in which light-emitting elements double as light-sensors to provide the display with user-interface functionality.

While a visual display incorporating a contrast enhancer can be augmented with touch sensor technology, such as with the technologies described above, to provide UI functionality, in other embodiments, such as embodiments represented by portion 1100 (identified at "11" in FIG. 1A) of FIG. 11, some or all of the LEEs (e.g., LEDs), here LEEs 1104, can also be used to provide the display with UI functionality. This can be done by using some or all of LEEs 1104 in the region(s) of visual display 1100 where display-based UI functionality is desired. When electrically biased, LEEs such as LEDs emit light. However, when they are not biased, environmental light striking them can cause them to act as photodiodes and, so, they can be used to detect and respond to environmental light. Consequently, when the ones of LEEs 1104 that also serve as photodiodes are distributed across the region(s) of visual display 1100 having UI functionality, suitable detection and mapping electronics 1108 can sense and map locations of shadows cast upon those photodiodes (e.g., from one or more pointing devices, such as one or more human fingers, among other things) and/or intentional concentrated light (e.g., from a laser pointer or other light-emitting device).

Detection and mapping electronics 1108 can also be configured to translate the mapped locations on visual display 1100 into screen coordinates in the process of providing the UI functionality. Each LEE 1104 desired to provide dual light-emitting and photodiode functionality can be controlled to alternately emit light and sense incoming light using suitable control electronics 1112. Those skilled in the art will readily understand how to design electronics suitable for control electronics 1112 and detection and mapping electronics 1108. For the purposes of this disclosure, including the appended claims, the term "electronics" includes hardwired circuitry on the one hand, a combination of software and hardware that executes the software, or both. It is noted that with this light-based UI, physical touching of the display is not necessary. It is further noted that this light-based UI need not be limited to displays having contrast enhancers made in accordance with aspects of the present disclosure.

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A visual-display structure, comprising:
a plurality of light-emitting elements (LEEs) arranged in an array so as to provide a plurality of pixels, wherein ones of the plurality of LEEs are physically spaced from one another to form inter-LEE spaces;
a support structure supporting the plurality of LEEs in the array and including electronic circuitry designed and configured for electrically connecting the plurality of pixels to an image driver that, when present and operating, drives the plurality of pixels so that the visual-display structure displays at least a portion of an image; and
a contrast enhancer coupled to the support structure and present in the inter-LEE spaces between adjacent ones of the plurality of LEEs, wherein the contrast enhancer comprises a metal sheet containing a plurality of openings corresponding to ones of the plurality of LEEs;
wherein the contrast enhancer comprises a ferromagnetic metal, and the contrast enhancer is coupled to the support structure by magnetic attraction to at least one magnet.

2. The visual-display structure according to claim 1, wherein the support structure comprises a circuit board and each of the plurality of LEEs is packaged into a light-emitting package that is attached to the circuit board after the light-emitting package has been manufactured, and the inter-LEE spaces are inter-package spaces.

3. The visual-display structure according to claim 1, wherein each of the plurality of LEEs is a non-package-type LEE.

4. The visual-display structure according to claim 3, wherein the plurality of LEEs are located in a layer beneath the contrast enhancer.

5. The visual-display structure according to claim 1, wherein the contrast enhancer has a viewing face that includes a treatment comprising a carbon nanotube coating.

6. The visual-display structure according to claim 2, wherein each of the plurality of light-emitting packages comprises a surface mount device.

7. The visual-display structure according to claim 1, wherein each of the plurality of openings in the contrast enhancer is an etched opening.

8. The visual-display structure according to claim 1, wherein the metal sheet of the contrast enhancer has a thickness of less than 0.6 mm.

9. The visual-display structure according to claim 1, wherein the support structure includes an electrostatic-discharge-protection grounding circuitry, and the metal sheet is electrically connected to the electrostatic-discharge-protection grounding circuitry.

10. The visual-display structure according to claim 1, further comprising a touch sensor, wherein the contrast enhancer functions as a conductive sheet of the touch sensor.

11. The visual-display structure according to claim 1, further comprising a touch sensor, wherein the contrast enhancer supports at least one conductive sensing element of the touch sensor.

12. A visual-display structure, comprising:
a plurality of light-emitting elements (LEEs) arranged in an array so as to provide a plurality of pixels, wherein ones of the plurality of LEEs are physically spaced from one another to form inter-LEE spaces;
a support structure supporting the plurality of LEEs in the array and including electronic circuitry designed and configured for electrically connecting the plurality of pixels to an image driver that, when present and operating, drives the plurality of pixels so that the visual-display structure displays at least a portion of an image; and
a contrast enhancer coupled to the support structure and present in the inter-LEE spaces between adjacent ones of the plurality of LEEs, wherein the contrast enhancer comprises a metal sheet containing a plurality of openings corresponding to ones of the plurality of LEEs;
wherein the contrast enhancer comprises a viewing face that includes a multicolor treatment that provides the viewing face with a graphic viewable when the visual-display structure is not energized.

13. A visual-display structure, comprising:
a plurality of light-emitting elements (LEEs) arranged in an array so as to provide a plurality of pixels, wherein ones of the plurality of LEEs are physically spaced from one another to form inter-LEE) spaces;
a support structure supporting the plurality of LEEs in the array and including electronic circuitry designed and configured for electrically connecting the plurality of pixels to an image driver that, when present and operating, drives the plurality of pixels so that the visual-display structure displays at least a portion of an image; and
a contrast enhancer coupled to the support structure and present in the inter-LEE spaces between adjacent ones of the plurality of LEEs, wherein the contrast enhancer comprises a metal sheet containing a plurality of openings corresponding to ones of the plurality of LEEs;
wherein the contrast enhancer is part of an electrostatic loudspeaker.

14. The visual-display structure according to claim 13, wherein the contrast enhancer comprises a stator of the electrostatic loudspeaker.

15. A visual-display structure, comprising:
a plurality of light-emitting elements (LEEs) arranged in an array so as to provide a plurality of pixels, wherein ones of the plurality of LEEs are physically spaced from one another to form inter-LEE spaces;
a support structure supporting the plurality of LEEs in the array and including electronic circuitry designed and configured for electrically connecting the plurality of pixels to the visual-display structure displays at least a portion of an image; and
a contrast enhancer coupled to the support structure and present in the inter-LEE spaces between adjacent ones of the plurality of LEEs, wherein the contrast enhancer comprises a metal sheet containing a plurality of openings corresponding to ones of the plurality of LEEs;
wherein the support structure includes at least one heat-sinking structure, and the metal sheet of the contrast enhancer is thermally coupled to the at least one heat-sinking structure.

16. A visual-display structure, comprising:
a plurality of light-emitting elements (LEEs) arranged in an array so as to provide a plurality of pixels, wherein ones of the plurality of LEEs are physically spaced from one another to form inter-LEE spaces;
a support structure supporting the plurality of LEEs in the array and including electronic circuitry designed and configured for electrically connecting the plurality of pixels to an image driver that, when present and operating, drives the plurality of pixels so that the visual-display structure displays at least a portion of an image: and
a contrast enhancer coupled to the support structure and present in the inter-LEE spaces between adjacent ones of the plurality of LEEs, wherein the contrast enhancer comprises a metal sheet containing a plurality of openings corresponding to ones of the plurality of LEEs;
wherein at least a portion of the contrast enhancer functions as a loudspeaker diaphragm and the visual-display structure further comprises at least one stator located to drive the at least a portion of the contrast enhancer.

17. The visual-display structure according to claim 16, wherein the contrast enhancer includes a first panel and a second panel spaced from one another, the visual-display structure further comprising at least one first stator located relative to the first panel of the contrast enhancer so as to drive the first panel as a first diaphragm of an ultrasonic loudspeaker and at least one second stator located relative to the second panel of the contrast enhancer so as to drive the second panel as a second diaphragm of the ultrasonic loudspeaker.

18. The visual-display structure according to claim 16, wherein the at least one stator is secured to the support structure and the at least a portion of the contrast enhancer is spaced from the at least one stator by an air gap.

19. A visual-display structure, comprising:
a plurality of light-emitting elements (LEEs) arranged in an array so as to provide a plurality of pixels, wherein ones of the plurality of LEEs are physically spaced from one another to form inter-LEE spaces;
a support structure supporting the plurality of LEEs in the array and including electronic circuitry designed and configured for electrically connecting the plurality of pixels to an image driver that, when present and operating, drives the plurality of pixels so that the visual-display structure displays at least a portion of an image; and
a contrast enhancer coupled to the support structure and present in the inter-LEE spaces between adjacent ones of the plurality of LEEs, wherein the contrast enhancer comprises a metal sheet containing a plurality of openings corresponding to ones of the plurality of LEEs;
wherein at least some of the LEEs function part of the time as photodiodes for providing the display structure a light-based user interface, the visual-display structure further comprising sensing and mapping electronics for sensing and mapping location of one or more shadows and/or one or more concentrations of light cast onto the display structure.

\* \* \* \* \*